(12) United States Patent
Sakamoto et al.

(10) Patent No.: US 6,965,357 B2
(45) Date of Patent: Nov. 15, 2005

(54) LIGHT-EMITTING ELEMENT DRIVE CIRCUIT

(75) Inventors: Hiroshi Sakamoto, Tokyo (JP); Tsukasa Hoshi, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 329 days.

(21) Appl. No.: 10/420,634

(22) Filed: Apr. 22, 2003

(65) Prior Publication Data
US 2003/0201950 A1   Oct. 30, 2003

(30) Foreign Application Priority Data
Apr. 26, 2002   (JP) .............................. 2002-127574

(51) Int. Cl.[7] .............................................. G09G 3/14
(52) U.S. Cl. ...................... 345/39; 345/212; 345/214
(58) Field of Search ........................ 345/39, 204, 207, 345/211–214; 340/815.45, 825.82; 257/88–97

(56) References Cited

U.S. PATENT DOCUMENTS

| | | | | |
|---|---|---|---|---|
| 4,307,469 A | * | 12/1981 | Casper et al. .............. | 398/195 |
| 4,518,986 A | * | 5/1985 | Hinn et al. ................. | 348/190 |
| 5,565,870 A | * | 10/1996 | Fukuhara et al. ............ | 342/70 |
| 2001/0052941 A1 | * | 12/2001 | Matsunaga et al. ......... | 348/308 |

* cited by examiner

Primary Examiner—Amare Mengistu

(57) ABSTRACT

A light-emitting element drive circuit capable of controlling the drive current of a light-emitting element in consideration of changes in a threshold value of the light-emitting element. A laser diode 1 emits light in accordance with a bias current Ib of a bias current drive circuit 2 and a light-emitting current Ip of a data current drive circuit 3. A photodiode 4 outputs a monitor current Im that corresponds to the optical output of the laser diode 1. A bias current feedback circuit 8 detects a change in the threshold current in accordance with the current Im, and outputs a control signal CS1. The bias current drive circuit 2 generates a bias current Ib that corresponds to the threshold current Ith of the laser diode 1 after the change. A light-emitting current feedback circuit 9 detects a change in the optical output of the laser diode 1 in accordance with the current Im, and outputs a controls signal CS2. The data current drive circuit 3 generates a light-emitting current Ip relative to a pre-determined optical output of the laser diode 1 in accordance with the control signal CS2.

9 Claims, 2 Drawing Sheets

LIGHT-EMITTING ELEMENT DRIVE CIRCUIT

BACKGROUND OF THE INVENTION

The present invention relates to light-emitting element drive circuits, and more particularly to a drive circuit suitable as a laser diode drive circuit.

A laser diode is a major component of an optical transmission system. The laser diode, which suffers poor yields due to manufacturing variations, accounts for a rather high percentage of the cost of the optical transmission system.

In a laser diode, it is difficult to maintain stable oscillation output because of fluctuations in characteristics based on manufacturing variations, changes in temperature characteristics of the laser diode, and changes over time (aging). Thus, to compensate for such variations, the laser diode typically has its drive current (forward current), If, controlled by an automatic power control (APC) circuit.

FIG. 3 is an electrical block circuit diagram of an automatic power control (APC) circuit. In FIG. 3, a laser diode 1 is supplied a drive current If that combines a bias current Ib output from a bias current drive circuit 2 and a light-emitting current Ip output from a data current drive circuit 3. That is, the bias current drive circuit 2 outputs the bias current Ib having an identical value to the current (threshold current Ith) where the laser diode 1 starts to emit light. The data current drive circuit 3 outputs the light-emitting current Ip based on data Tx.

Thus, the laser diode 1 emits light in response to the light-emitting current Ip output from the data current drive circuit 3, that is, in response to the data Tx. A monitoring photodiode 4 receives the light of the laser diode 1, and outputs a monitor current Im that corresponds to the optical output Po received. The monitor current Im of the monitoring photodiode 4 is output to a shunt register R. A feedback circuit 10 receives a monitor voltage that is in proportion to the monitor current Im associated with the shunt register R, and compares the resulting monitor voltage with an initial setup value that is set by factory default, for example. In other words, as shown in FIG. 4, if characteristic A during initial setting of the laser diode 1 changes to characteristic B due to aging, temperature variations, and other factors of the laser diode 1, so that the optical output Po decreases relative to the drive current If, then the monitor current Im also decreases correspondingly. Thus, when the monitor current changes so that it is no longer the initial setup value, the feedback circuit 10 outputs a first control signal CS1 and a second control signal CS2 to the bias current drive circuit 2 and the data current drive circuit 3, respectively, so that the monitor current Im is the current at the time of initial setup The bias current drive circuit 2 and data current drive circuit 3 adjust the bias current Ib and light-emitting current Ip, respectively, based on the first control signal CS1 and second control signal CS2. When the bias current Ib and light-emitting current Ip are adjusted, that is, the drive current If is adjusted, the optical output Po is controlled to the output Pos of the initial setting in the laser diode 1. That is, even if aging or temperature changes occur, the laser diode 1 is controlled so that the optical output Po is always maintained constant relative to the data Tx.

Meanwhile, it is important, from the standpoint of adjusting the bias current Ip and controlling the light emission of the laser diode 1, to measure the extinction ratio (ratio of optical output during lighting and optical output during extinction). That is, the laser diode 1 suffers changes in the threshold voltage Ith of the laser diode 1 due to aging, temperature variations, and so forth. More specifically, characteristic A during initial setting changes to characteristic B as the laser diode suffers changes in the threshold current Ith to Ith1 due to aging, temperature variations, and so forth, as shown in FIG. 4. Thus, it is important to measure the threshold current Ith and accurately control the bias current Ib and light-emitting current Ip based on the measured threshold current Ith.

However, with the aforedescribed automatic power control (APC) circuit, control cannot be achieved in consideration of changes in the threshold current Ith. That is, the feedback circuit 10 of the automatic power control circuit smoothes the monitor current Im to a direct current via a filter circuit within the circuit 10, thereby detecting a change in the optical output Po. As a result, changes in the threshold current Ith cannot be detected, so that the bias current Ib and light-emitting current Ip cannot be controlled in consideration of changes in the threshold current Ith.

The present invention is designed to solve the aforedescribed problem and has as its objective to provide a light-emitting element drive circuit capable of controlling the drive current of the light-emitting element in accordance with changes in the threshold current thereof.

SUMMARY OF THE INVENTION

The invention according to claim 1 provides a light-emitting element drive circuit, comprising: a first drive current generation circuit for outputting a threshold current of a light-emitting element to a light-emitting element as a bias current; and a second drive current generation circuit for outputting to the light-emitting element a light-emitting current that causes the light-emitting element to emit light with a pre-determined optical output based on a data signal, the light-emitting element drive circuit further comprising: a sensing light-receiving element for receiving light from the light-emitting element and outputting a sense signal that corresponds to the optical output thereof; a timing signal generation circuit for outputting a first timing signal when a pre-determined threshold current arrival time has elapsed during extinction, based on the data signal; a first sampling circuit for sampling the sense signal in response to the first sampling signal, and outputting the sampled sense signal as a first sense signal; and a first adjustment circuit for detecting a change in the threshold current based on the first sense signal, and causing the first drive current generation circuit to generate a bias current that corresponds to the threshold current of the light-emitting element after the change.

The invention according to claim 2 provides a light-emitting element drive circuit, comprising: a first drive current generation circuit for outputting a threshold current of a light-emitting element to the light-emitting element as a bias current; a second drive current generation circuit for outputting to the light-emitting element a light-emitting current that causes the light-emitting element to emit light with a pre-determined optical output based on a data signal; a sensing light-receiving element for receiving light from the light-emitting element and outputting a sense signal that corresponds to the optical output thereof; a timing signal generation circuit for outputting a first sampling signal when a pre-determined threshold current arrival time has elapsed during extinction, based on the data signal, and outputting a second sampling signal when a pre-determined light-emitting output arrival time has elapsed during light emission; a first sampling circuit for sampling the sense signal in response to the first sampling signal, and outputting the sampled sense signal as a first sense signal; a second sampling circuit for sampling the sense signal in response to the second sampling signal, and outputting the sampled sense signal as a second sense signal; a first adjustment circuit for detecting a change in the threshold current based on the first sense signal, and generating an adjustment signal that causes the first drive current generation circuit to generate a bias current that corresponds to the threshold current of the light-emitting element after the change; and a second adjustment circuit for detecting a change in the optical output based on the second sense signal, and generating an adjustment signal that causes the second drive current generation circuit to generate a light-emitting current that corresponds to the pre-determined optical output of the light-emitting element.

The invention according to claim 3 provides a light-emitting element drive circuit according to claim 1 or 2, wherein the timing signal generation circuit starts time-counting operation when the data that causes light extinction is lost, and outputs the first sampling signal when the resulting lost state remains for a predetermined threshold current arrival time.

The invention according to claim 4 provides a light-emitting element drive circuit according to claim 2, wherein the timing signal generation circuit starts time-counting operation when the data that causes light emission is output, and outputs the second sampling signal when the resulting output state remains for a predetermined light-emitting output arrival time.

The invention according to claim 5 provides a light-emitting element drive circuit according to claim 1 or 2, wherein the light-emitting element is a laser diode. The invention according to claim 6 provides a light-emitting element drive circuit according to claim 1 or 2, wherein the sensing light-receiving element is a photodiode.

According to the invention described in claim 1, the first adjustment circuit detects a change in the threshold current, based on the first sense signal. The first drive current generation circuit generates a bias current that corresponds to the threshold current of the light-emitting element after the change, based on the adjustment signal from the first adjustment circuit. Thus, an accurate threshold current can be consistently supplied, as a bias current, to the light-emitting element, despite temperature-dependent changes in characteristics of the light-emitting element or changes in characteristics due to its aging. According to the invention described in claim 2, a bias current corresponding to the threshold current can be generated accurately, in a similar manner to the invention described in claim 1. Furthermore, the second adjustment circuit detects a change in the optical output of the light-emitting element, based on the second sense signal. Then, the second drive current generation circuit generates a light-emitting current corresponding to a predetermined optical output of the light-emitting element, based on the adjustment signal from the second adjustment circuit. Thus, an accurate drive current can be consistently supplied to the light-emitting element, despite temperature-dependent changes in characteristics of the light-emitting element or changes in characteristics due to its aging.

According to the invention described in claim 3, the timing when the timing signal generation circuit outputs the sampling signal is generated based on the data signal. Thus, the first sampling circuit can sample a sense signal corresponding to a threshold current value that converges to a fixed value.

According to the invention described in claim 4, the timing when the timing signal generation circuit outputs the sampling signal is generated based on the data signal. Thus, the second sampling circuit can sample a sense signal corresponding to an optical output amount that converges to a fixed value.

According to the invention described in claim 5, the laser diode can attain a good light-emitting characteristic and according to the invention described in claim 6, the photodiode can generate a monitor current that is in proportion to the amount of light received.

DETAILED DESCRIPTION OF THE INVENTION

One embodiment of a laser diode drive circuit that embodies a light-emitting element drive circuit of the present invention is described in detail below with reference to FIGS. 1 and 2.

Figure 1:
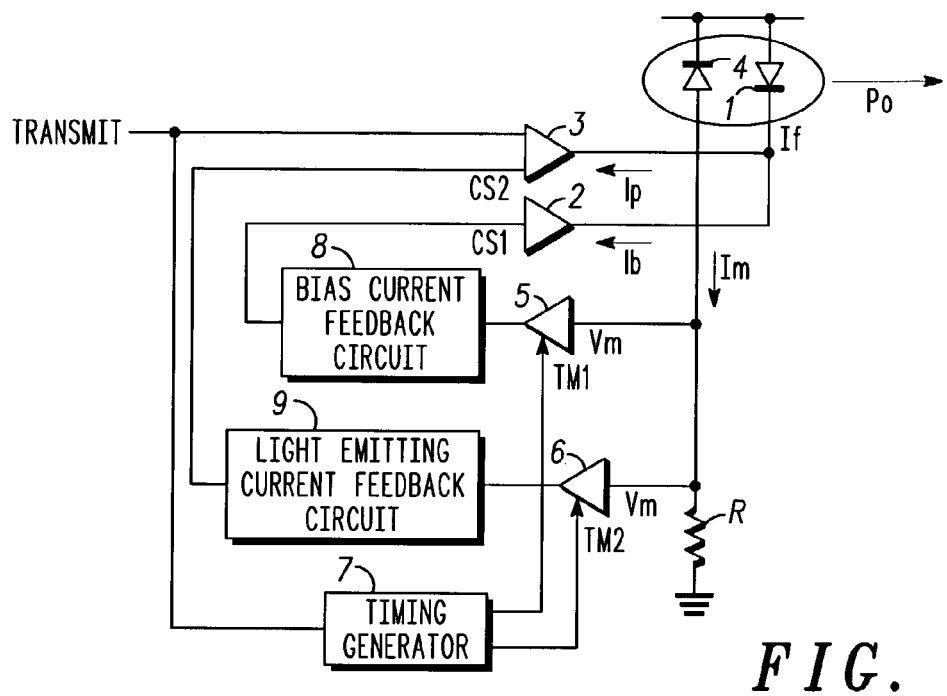
FIG. 1 is an electrical block circuit diagram of a laser diode drive circuit according to the present invention.

FIG. 1 is an electrical block circuit diagram of a laser diode drive circuit. FIG. 2 is an operational timing diagram for each component circuit of the laser diode drive circuit. In FIG. 1, a laser diode 1 that acts as a light-emitting element is supplied with a drive current If that is a combination of a bias current Ib output from a bias current drive circuit 2 and a light-emitting current Ip output from a data current drive circuit 3. The bias current drive circuit 2 acts as a first drive current generation circuit and outputs the bias current Ib having an identical value to the current (threshold current Ith) where the laser diode 1 starts to emit light. The data current drive circuit 3 that acts as a second drive current generation circuit outputs the light-emitting current Ip that causes a pre-determined optical output Pos relative to data Tx to be emitted. The data Tx is a pulse signal having a certain pulse width as shown in FIG. 2 (unit width of T, in FIG. 2), and the data current drive circuit 3 outputs the light-emitting current Ip while the data Tx is input. Thus, the laser diode 1 emits light in accordance with the light-emitting current Ip output from the data current drive circuit 3.

Figure 2:
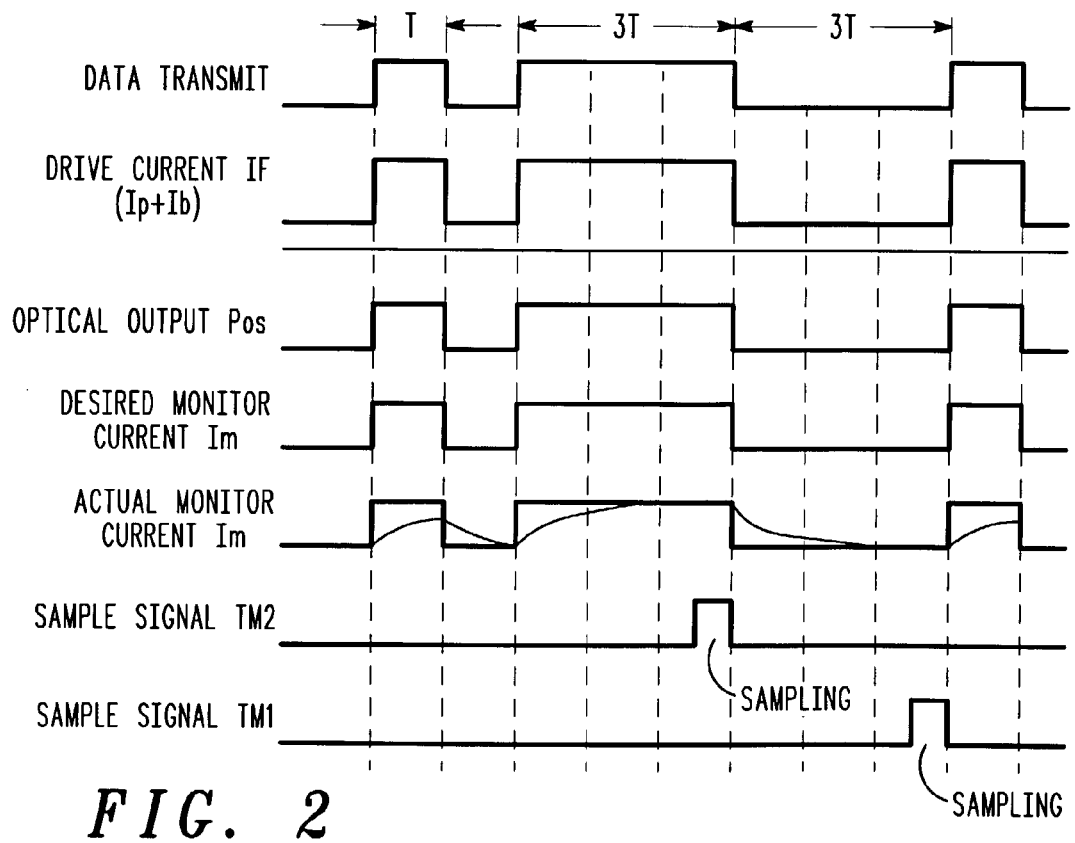
FIG. 2 is an operational timing chart of each component circuit of the laser diode drive circuit according to the present invention.
Figure 3:
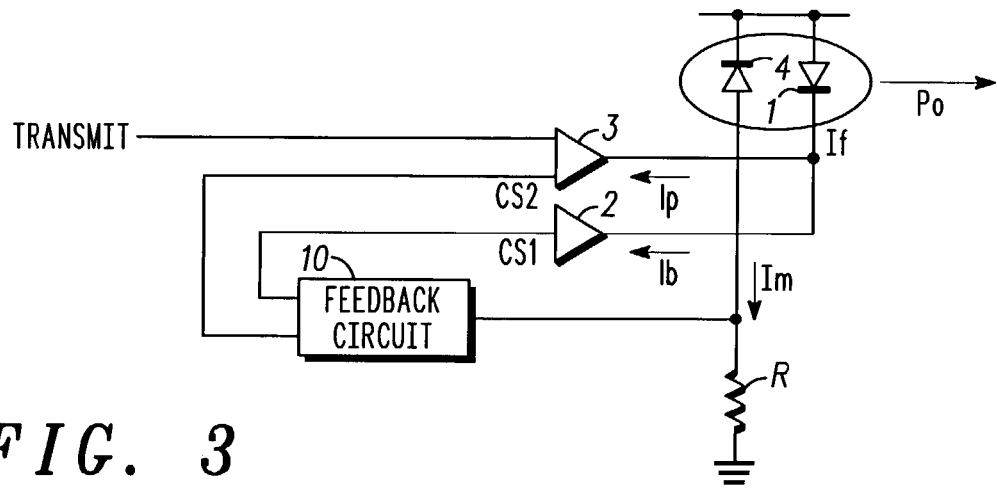
FIG. 3 is an electrical block circuit diagram of a prior art automatic power control circuit.
Figure 4:
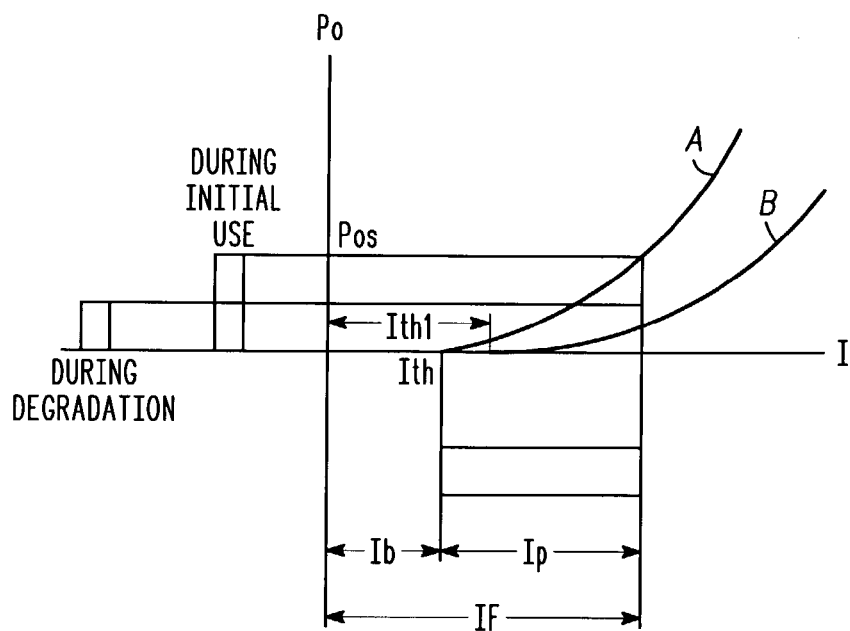
FIG. 4 is a diagram depicting light-emitting operation characteristics during initial use and degradation of a prior art laser diode.

The monitoring photodiode 4 that acts as a sensing light-receiving element receives light of the laser diode 1, and outputs a monitor current Im as a sense signal that corresponds to the optical output Po received, as shown in FIG. 2. The monitor current Im is supplied to a shunt resister R. Thus, the voltage across the shunt resistor R is a voltage (monitor voltage) Vm that is proportional to the monitor current Im. The monitor voltage Vm that is proportional to the monitor current Im is supplied to a first sample-and-hold circuit 5 that acts as a first sampling circuit and to a second sample-and-hold circuit that acts as a second sampling circuit.

It should be appreciated that the actual monitor current Im does not reach a desired monitor current Imo at the same time with the light emission of the laser diode due to parasitic capacitance and other factors, but reaches it after a certain time (light-emitting output arrival time). In the present embodiment, when the data Tx having a pulse width of 3T or longer is output, as shown in FIG. 2, the actual monitor current Im converges to the desired monitor current Imo after 2T time has elapsed.

Similarly, the actual monitor current Im does not reach a desired threshold current Ith at the same time with the light extinction of the laser diode 1, but reaches it after a certain time (threshold current arrival time). In the present embodiment, when the data Tx is lost and the resulting lost time (lost state) remains for 2T time, as shown in FIG. 2, the actual monitor current Im converges to the desired threshold current Ith.

The first sample-and-hold circuit 5 samples the monitor voltage Vm in response to a first sampling signal TM1 from a timing generator 7. The first sample-and-hold circuit 5 then outputs the sampled monitor voltage Vm to a bias current feedback circuit 8.

The second sample-and-hold circuit 6 samples the monitor voltage Vm in response to a second sampling signal TM2 from the timing generator 7. The sample-and-hold circuit 6 then outputs the sampled monitor voltage Vm to a light-emitting current feedback circuit 9.

The timing generator 7 that acts as a timing signal generation circuit inputs the data Tx. The timing generator 7 generates and outputs the first and second sampling signals TM1 and TM2 in accordance with the data Tx.

More specifically, the timing generator 7 counts the time when the data TX is output and the time when the data Tx is lost, and generates and outputs the first and second sampling signals TM1 and TM2. The timing generator 7 outputs the first sampling signal TM1 when the data Tx is lost and the resulting lost time has elapsed for 2.5T time (threshold current arrival time). That is, as 2.5T time has elapsed since the data Tx is lost, the timing generator 7 determines that the monitor current Im has reliably converged to the desired threshold current Ith, as described above, and outputs the first sampling signal TM1. Thus, the first sample-and-hold circuit 5 samples the monitor voltage Vm in response to the first sampling signal TM1, when the monitor current Im has converged to the desired threshold current Ith, even though the laser diode 1 is extinct.

When data Tx having a pulse width of 3T or longer is output, the timing generator 7 outputs the second sampling signal TM2 as (the output state) remains for time 2.5T (light-emitting output arrival time) since the data TX is output. That is, as the data Tx remains output for 2.5T time or longer, the timing generator 7 determines that the monitor current Im has reliably converged to the desired monitor current Imo, as described above, and outputs the second sampling signal TM2. Thus, the second sample-and-hold circuit 6 samples the monitor voltage Vm in response to the second sampling signal TM2, when the laser diode 1 is emitting light and the monitor current Im has converged to the desired monitor current Imo.

The monitor voltage Vm that corresponds to the desired threshold current Ith, sampled by the first sample-and-hold circuit 5, is output to the bias current feedback circuit that acts as a first adjustment circuit. The bias current feedback circuit 8 compares the monitor voltage Vm with a reference voltage value that corresponds to an initial-setup threshold current Ith that is pre-stored. That is, the bias current feedback circuit 8 detects a change in the threshold current Ith due to variations in the characteristic of the laser diode 1. The bias current feedback circuit 8 outputs to the bias current drive circuit 2 a first control signal CS1 as a first adjustment signal at that time, that is, so that the desired threshold current Ith is reached, in accordance with the detection result.

The bias current drive circuit 2 outputs the bias current Ib in accordance with the first control signal CS1, as adjusted to match the threshold current Ith that is varied due to variations in the characteristic of the laser diode 1.

The monitor voltage Vm that corresponds to the desired monitor current Imo sampled by the second sample-and-hold circuit 6 is output to the light-emitting current feedback circuit 9 that acts as a second adjustment circuit. The light-emitting current feedback circuit 9 compares the monitor voltage Vm with a reference voltage value that corresponds to an initial setup monitor current Imo that is pre-stored. That is, the light-emitting current feedback circuit 9 detects a change in the optical output Po due to variations in the characteristic of the laser diode 1. The light-emitting current feedback circuit 9 outputs to the data current drive circuit 3 a second control signal CS2 as a second adjustment signal at that time, that is, so that the light-emitting current Ip for causing said optical output Pos to be emitted is reached, in accordance with the detection result.

The data current drive circuit 3 outputs the light-emitting current Ip in accordance with the second control signal CS2, as adjusted so that the optical output Po varied due to variations in the characteristic of the laser diode 1 provides a pre-determined optical output Pos.

Next, the features of the laser diode drive circuit so configured are described below. (1) In the present embodiment, the timing generator 7 counts the time when the data Tx is output and the time when the data Tx is lost, and outputs the first sampling signal TM1 when the monitor current Im has reliably converged to the desired (actual) threshold current Ith. The first sample-and-hold circuit then samples the monitor voltage Vm corresponding to the desired (actual) threshold current Ith at that time. In accordance with the sampled monitor voltage Vm, the bias current feedback circuit 8 outputs the first control signal CS1 to the bias current drive circuit 2 so that the bias current Ib reaches the desired (actual) threshold current Ith. The bias current drive circuit 2 then outputs the bias current Ib in accordance with the first control signal CS1, so that it matches the threshold current Ith varied due to variations in the characteristic of the laser diode 1.

Thus, the threshold current Ith that varies due to temperature-dependent variations in the characteristic of the laser diode 1, aging, and other factors can be detected accurately, and the bias current Ib can be adjusted in accordance with such variations, so that the drive current If for consistently controlling the laser diode 1 to the pre-determined optical output Pos can be controlled with a high degree of accuracy.

(2) In the present embodiment, the timing generator 7 outputs the second sampling signal TM2 when it determines that the monitor current Im has reliably converged to the desired monitor current Imo. The second sample-and-hold circuit 6 then samples the monitor voltage Vm corresponding to the desired monitor current Imo while the laser diode 1 is emitting light. In accordance with the sampled monitor voltage Vm, the light-emitting current feedback circuit 9 outputs the second control signal CS2 to the data current drive circuit 3 so that the light-emitting current Ip reaches the predetermined optical output Pos. The data current drive circuit 3 then outputs the light-emitting current Ip in accordance with the second control signal CS2, so that the optical output Po varied due to variations in the characteristic of the laser diode 1 provides the pre-determined optical output Pos.

Thus, under condition where the bias current Ib has been adjusted accurately as described above, the light-emitting current Ip that varies due to temperature-dependent variations in the characteristic of the laser diode 1, aging, and other factors can be detected accurately, and the drive current If for consistently controlling the laser diode 1 to the pre-determined optical output Pos can be controlled with a high degree of precision.

It should be appreciated that the embodiment of the present invention is not limited to the aforedescribed embodiment, but may be modified as follows. Although the aforedescribed embodiment has been embodied in the drive circuit for the laser diode as a light-emitting element, it may also be applied to a drive circuit for light-emitting diodes and other light-emitting elements.

Although the aforedescribed embodiment has been embodied in the photodiode as a light-receiving element, it may be implemented with phototransistors and other light-receiving elements. In the aforedescribed embodiment, the first sample-and-hold circuit 5 and bias current feedback circuit 8 for controlling the threshold current Ith are provided, and the second sample-and-hold circuit 6 and light-emitting current feedback circuit 9 for controlling the light-emitting current Ip relative to the optical output Po are provided. Instead, it may also be applied to a light-emitting element drive circuit comprised only of the first sample-and-hold circuit 5 and bias current feedback circuit 8 for controlling the threshold current Ith.

The afore-described embodiment may be implemented by two sample-and-hold circuits, i.e. the first sample-and-hold circuit 5 and second sample-and-hold circuit 6.

As described in detail above, according to the present invention, the drive current of the light-emitting element can be controlled in consideration of a change in the threshold current thereof.

What is claimed is:

1. A light-emitting element drive circuit, comprising:
   a first drive current generation circuit for outputting a threshold current of a light-emitting element to a light-emitting element as a bias current and a second drive current generation circuit for outputting to the light-emitting element a light-emitting current that causes the light-emitting element to emit light with a predetermined optical output based on a data signal, the light-emitting element drive circuit further comprising:
   a sensing light-receiving element for receiving light from the light-emitting element and outputting a sense signal that corresponds to the optical output thereof;
   a timing signal generation circuit for outputting a first timing signal when a pre-determined threshold current arrival time has elapsed during extinction, based on the data signal;
   a first sampling circuit for sampling the sense signal in response to the first sampling signal, and outputting the sampled sense signal as a first sense signal; and
   a first adjustment circuit for detecting a change in the threshold current based on the first sense signal, and causing the first drive current generation circuit to generate a bias current that corresponds to the threshold current of the light-emitting element after the change.

2. The light-emitting element drive circuit according to claim 1, wherein the timing signal generation circuit starts time-counting operation when the data that causes light extinction is lost, and outputs the first sampling signal when the resulting lost state remains for a predetermined threshold current arrival time.

3. The light-emitting element drive circuit according to claim 1, wherein the light-emitting element is a laser diode.

4. The light-emitting element drive circuit according to claim 1, wherein the sensing light-receiving element is a photodiode.

5. A light-emitting element drive circuit, comprising:
   a first drive current generation circuit for outputting a threshold current of a light-emitting element to a light-emitting element as a bias current;
   a second drive current generation circuit for outputting to the light-emitting element a light-emitting current that causes the light-emitting element to emit light with a predetermined optical output based on a data signal;
   a sensing light-receiving element for receiving light from the light-emitting element and outputting a sense signal that corresponds to the optical output thereof;
   a timing signal generation circuit for outputting a first sampling signal when a pre-determined threshold current arrival time has elapsed during extinction, based on the data signal, and outputting a second sampling signal when a predetermined light-emitting output arrival time has elapsed during light emission;
   a first sampling circuit for sampling the sense signal in response to the first sampling signal, and outputting the sampled sense signal as a first sense signal;
   a second sampling circuit for sampling the sense signal in response to the second sampling signal, and outputting the sampled sense signal as a second sense signal;
   a first adjustment circuit for detecting a change in the threshold current based on the first sense signal, and generating an adjustment signal that causes the first drive current generation circuit to generate a bias current that corresponds to the threshold current of the light-emitting element after the change; and
   a second adjustment circuit for detecting a change in the optical output based on the second sense signal, and generating an adjustment signal that causes the second drive current generation circuit to generate a light-emitting current that corresponds to the pre-determined optical output of the light-emitting element.

6. The light-emitting element drive circuit according to claim 5, wherein the timing signal generation circuit starts time-counting operation when the data that causes light extinction is lost, and outputs the first sampling signal when the resulting lost state remains for a predetermined threshold current ax-rival time.

7. The light-emitting element drive circuit according to claim 5, wherein the timing signal generation circuit starts time-counting operation when the data that causes light emission is output, and outputs the second sampling signal when the resulting output state remains for a predetermined light-emitting output arrival time.

8. The light-emitting element drive circuit according to claim 5, wherein the light-emitting element is a laser diode.

9. The light-emitting element drive circuit according to claim 5, wherein the sensing light-receiving element is a photodiode.

* * * * *